(12) United States Patent
Dallesasse et al.

(10) Patent No.: US 8,948,226 B2
(45) Date of Patent: Feb. 3, 2015

(54) SEMICONDUCTOR DEVICE AND METHOD FOR PRODUCING LIGHT AND LASER EMISSION

(71) Applicant: The Board of Trustees of The University of Illinois, Urbana, IL (US)

(72) Inventors: John Dallesasse, Geneva, IL (US); Milton Feng, Champaign, IL (US)

(73) Assignee: The Board of Trustees of The University of Illinois, Urbana, IL (US)

( * ) Notice: Subject to any disclaimer, the term of this patent is extended or adjusted under 35 U.S.C. 154(b) by 0 days.

(21) Appl. No.: 13/958,522

(22) Filed: Aug. 2, 2013

(65) Prior Publication Data

US 2014/0050241 A1    Feb. 20, 2014

Related U.S. Application Data

(60) Provisional application No. 61/742,835, filed on Aug. 20, 2012.

(51) Int. Cl.
*H01S 5/34* (2006.01)
*H01S 5/062* (2006.01)
(Continued)

(52) U.S. Cl.
CPC ........... *H01S 5/3401* (2013.01); *H01S 5/06203* (2013.01); *H01S 5/3419* (2013.01); *H01S 5/06206* (2013.01); *H01S 5/2215* (2013.01); *H01S 5/34313* (2013.01); *H01S 5/0208* (2013.01)
USPC ..................................................... 372/45.01

(58) Field of Classification Search
CPC ............ H01S 5/06203; H01S 5/06206; H01S 5/0208; H01S 5/3401; H01S 5/3419; H01S 5/34313; H01S 5/2215

USPC ........................................................ 372/45.01
See application file for complete search history.

(56) References Cited

U.S. PATENT DOCUMENTS

| 6,055,254 | A | * | 4/2000 | Capasso et al. | ............ 372/45.01 |
| 7,091,082 | B2 | | 8/2006 | Feng et al. | ..................... 438/235 |

(Continued)

FOREIGN PATENT DOCUMENTS

| WO | WO/2005/020287 | 3/2005 |
| WO | WO/2006/093883 | 9/2006 |

OTHER PUBLICATIONS

W.G. Spitzer et al, "Infrared Absorption and Electron Effective Mass in n-Type Gallium Arsenide", Phys. Rev. 114, 59, 1959.

(Continued)

*Primary Examiner* — Xinning Niu
(74) *Attorney, Agent, or Firm* — Martin Novack

(57) ABSTRACT

A method for producing light emission, including the following steps: providing a transistor structure that includes a semiconductor base region disposed between a semiconductor emitter region and a semiconductor collector region; providing a cascade region between the base region and the collector region, the cascade region having a plurality of sequences of quantum size regions, the quantum size regions of the sequences varying, in the direction toward the collector region, from a relatively higher energy state to a relatively lower energy state; providing emitter, base and collector electrodes respectively coupled with the emitter, base, and collector regions; and applying electrical signals with respect to the emitter, base, and collector electrodes to cause and control light emission from the cascade region.

28 Claims, 8 Drawing Sheets

(51) Int. Cl.
  *H01S 5/22* (2006.01)
  *H01S 5/343* (2006.01)
  *H01S 5/02* (2006.01)

(56) References Cited

U.S. PATENT DOCUMENTS

| | | | |
|---|---|---|---|
| 7,286,583 B2 | 10/2007 | Feng et al. | 372/30 |
| 7,354,780 B2 | 4/2008 | Feng et al. | 257/292 |
| 7,535,034 B2 | 5/2009 | Walter et al. | 372/43 |
| 7,693,195 B2 | 4/2010 | Feng et al. | 372/30 |
| 2005/0040432 A1 | 2/2005 | Feng et al. | 257/198 |
| 2007/0201523 A1* | 8/2007 | Walter et al. | 372/43.01 |
| 2008/0240173 A1 | 10/2008 | Holonyak et al. | 372/9 |
| 2009/0134939 A1 | 5/2009 | Feng et al. | 327/581 |
| 2010/0034228 A1* | 2/2010 | Holonyak et al. | 372/45.01 |
| 2010/0202483 A1 | 8/2010 | Walter et al. | 372/45.01 |
| 2010/0202484 A1 | 8/2010 | Holonyak, Jr. et al. | 372/45.01 |

OTHER PUBLICATIONS

Jerome Faist et al. "Quantum Cascade Laser", Science, V264, Apr. 1994.

Sirtori et al., "Low-Loss Al-Free Waveguides for Unipolar Semiconductor Lasers", APL, V75, N25, Dec. 1999.

M. Giehler et al., "Effect of Free-Carrier Absorption on the Threshold Current Density of GaAs/(Al,Ga) As Quantum-Cascade Lasers", J. Appl. Phys. V96, N9, Nov. 2004.

J.S. Yu et al. "High-Power λ~9.5 μm Quantum-Cascade Lasers Operating Above Room Temperature in Continuous-Wave Mode", APL, V88, 091113, 2006.

L. Diehl, et al. "High-Power Quantum Cascade Lasers Grown by Low-Pressure Metal Organic Vapor-Phase Epitaxy Operating In Continuous Wave Above 400 K", APL, V88, 201115, 2006.

A. Lyakh, et al. "3 W Continuous-Wave Room Temperature Single-Facet Emission From Quantum Cascade Lasers Based on Nonresonant Extraction Design Approach", APL, V95, 141113, 2009.

J. Faist, "Wallplug Efficiency of Quantum Cascade Lasers: Critical Parameters and Fundamental Limits", APL, V90, 253512, 2007.

P.Q. Liu, et al. "High Power-Efficient Quantum Cascade Lasers", Nature Photonics, V4, Feb. 2010.

S.A. Maranowski, et al. "Native Oxide Top- and Bottom-Confined Narrow Stripe p-n. $Al_yGa_{1-y}As$—GaAs—$In_xGa_{1-x}As$ Quantum Well Heterostructure Laser", Appl. Phys. Let. 63 (12), 1660 (1993).

D.L. Huffaker, et al., "Native-Oxide Defined Ring Contact for Low Threshold Vertical-Cavity Lasers" Appl. Phys. Lett 65 (1), 97, 1994.

\* cited by examiner

FIG. 2(a)      FIG. 2(b)
PRIOR ART          PRIOR ART

SEMICONDUCTOR DEVICE AND METHOD FOR PRODUCING LIGHT AND LASER EMISSION

PRIORITY CLAIM

Priority is claimed from U.S. Provisional Patent Application No. 61/742,835, filed Aug. 20, 2012, and said U.S. Provisional Patent Application is incorporated herein by reference.

FIELD OF THE INVENTION

This invention relates to the field of semiconductor light emitting and lasing devices and methods.

BACKGROUND OF THE INVENTION

Quantum cascade lasers (QCLs) are semiconductor lasers that emit in the infrared portion of the electromagnetic spectrum and were first demonstrated during the mid-1990's. Unlike typical interband semiconductor lasers that emit electromagnetic radiation through the recombination of electron-hole pairs across the material band gap, QCLs are unipolar and laser emission is achieved through the use of intersubband transitions in a superlattice.

QLCs are important because of their ability to produce coherent radiation in the near to mid-IR through the terahertz frequency bands. At the same time, a weakness of the QCL is that it is a two terminal n+-i-n semiconductor device with current injection into the cascade region limited by the resistance of the structure and the applied voltage. Because a field is required in the cascade region of a QCL to overcome the quasi-static electric field associated with the bandgap grating between cascade regions, the devices tend to operate at higher voltages than standard semiconductor diode lasers. Direct modulation at high speed is therefore a greater challenge for QCL lasers.

The conventional two-terminal QCL relies on an induced field in the cascade region for operation yet has no independent way to decouple field from current. Field variation affects the transitions that produce gain in the cavity. More specifically, in one of the common embodiments of the QCL, basic operation of the device relies on a transition from an electron in a high-energy quantum state in a narrow first quantum well to a lower energy state in a wider adjacent quantum well. This is illustrated in FIG. 1, in which an electron is represented as transitioning from a high energy quantum state to a lower energy quantum state. The electric field across the well effects the bending of the bands. As the magnitude of the field changes, as would occur under modulation, the location of the energy levels in the quantum wells also changes. This is illustrated in FIG. 2, which is a depiction of the fundamental QCL electron transition under two bias conditions illustrating the change in band bending and transition energy. In this illustration, a higher electric field would be present across the structure in case (b). The graph (c) shows the exemplary points of (a) and (b) on an I-V plot. As a secondary effect, the magnitude of the probability density function $\psi^*\psi$ of an electron in the higher energy well in the spatial location of the lower energy well, which affects transition probability, will also be modified by applied field and, by direct relation, the modulation voltage.

Free carrier absorption is a significant parameter in the operation of quantum cascade lasers. The general formula for free-carrier absorption is:

$$\alpha_f = \frac{Nq^2\lambda^2}{m^* 8\pi n c^3 \tau} \quad (1)$$

where N is the carrier concentration, n is the index of refraction, and $\tau$ is the relaxation time. (See e.g. Pankkove, "Optical Processes In Semiconductors", Dover, N.Y., 1975). As can be seen from this general expression, free carrier absorption is directly proportional to the carrier concentration and proportional to the square of the wavelength. The graphs of FIG. 3, including the Table thereof, show the absorption coefficient for n-GaAs as a function of doping (see Spitzer and Whelan, Phys. Rev. 114, 59). This data shows the strong influence of doping density and wavelength on absorption in the mid-IR. The significant increase in absorption that occurs starting near a wavelength of 3 μm illustrates the need to minimize the overlap of the optical field with doped regions. Another point to note is that sample 1, which is undoped and has a carrier concentration less than 5E14 cm$^{-3}$, shows the typical increase in absorption at the band edge but has no measurable absorption at wavelengths longer than 1.0 μm.

A number of papers on Quantum Cascade Lasers (QCLs) discuss free carrier absorption. Developments that have improved QCL performance in recent years have included waveguide structures to limit overlap of the optical mode with doped regions of the n+-i-n structure, as well as to improve thermal management. Other improvements have been associated with structures that inject and remove carriers from the upper and lower energy states in the cascade region more efficiently. Reference can be made, for example, to the following publications.

Faist, et. al. (Science, V264, April 1994, pp. 553) measured a threshold current density of ~14 kA/cm$^2$, and estimated an internal loss of ~9 cm$^{-1}$ from a combination of free carrier absorption, waveguide scattering loss, and plasmon losses in from the electrical contact. (Other key parameters were a gain of 9 cm$^{-1}$ kA$^{-1}$ cm$^{-2}$, emission wavelength of 4.26 μm, and a mirror reflectivity of 27%.) No specific attempts were made to control internal loss other than the use of an n+-i-n structure.

Sirtori et. al. (APL, V75, N25, December 1999, pp. 3911) discusses contributions to internal optical loss, and uses doping density changes to provide optical confinement. Threshold current densities of ~4.7 kA/cm$^2$ and cavity losses of 20 cm$^{-1}$ were measured for devices operated at 77 K having a wavelength of 9 μm. He also points out that the optical absorption in the n+ region of their device is 1740 cm$^{-1}$, which still contributes 14 cm$^{-1}$ of loss when multiplied by the confinement factor $\Gamma$ in that region. This reinforces the need to minimize optical overlap with doped regions.

Giehler, et. al. (J. Appl. Phys. V96, N9, Nov. 2004, pp. 4755) discusses the effect of free carrier absorption on the threshold current density of QCLs. This work confirms the contribution of free carrier losses in regions outside of the cascade region to the threshold current density and provides further detail on the use of the confinement factor $\Gamma$ to estimate the contribution of free carrier loss to total loss on a layer-by-layer basis.

Yu, et. al. (APL, V88, 091113, 2006) shows cw, room temperature operation of a 9.5 μm QCL with a threshold current density of 1.57 kA/cm$^2$. Minimization of free carrier absorption through structure, process, and waveguide design coupled with thermal management are highlighted as the key techniques for improving performance.

Diehl, et. al. (APL, V88, 201115, 2006) shows operation to 204 mW at 300 K at an emission wavelength of 8.38 μm.

Internal waveguide loss was ~8.3 cm$^{-1}$. Threshold current densities at room temperature were 1.9 kA/cm$^2$. The structure was designed to minimize optical overlap with regions having a higher doping density (free carrier loss) or plasmon-related loss.

Lyakh, et. al. (APL, V95, 141113, 2009) shows 3 W cw, room temperature operation at an emission wavelength of 4.6 μm. Threshold current density was 0.86 kA/cm$^2$, and wallplug efficiency was 12.7%. The key improvement was in the design of the cascade region, but the paper also mentions "doping level was empirically adjusted so that roll over current density of the optical power vs. current characteristic was approximately equal to 3 kA/cm$^2$." Waveguide losses were measured to be 2.6 cm$^{-1}$.

Faist (APL, V90, 253512, 2007) provides a generalized analytical treatment of wall plug efficiency. This paper highlights the role of in-plane scattering (layer interface roughness) and free carrier absorption in limiting wall plug efficiency.

Liu, et. al. (Nature Photonics, V4, February 2010, pp. 95) discusses improvements in wall plug efficiency through more efficient transport of electrons into the laser active region. The paper also mentions the susceptibility of the tunneling rate to changes in bias.

The QCL has a higher operating voltage than diode lasers, and requires a larger drive current. This is illustrated in FIG. 4 which shows the current-voltage characteristics from typical commercially available QCLs. Curve (a) shows the I-V characteristic for a QCL emitting at a wavelength of 5 μm, while curve (b) is for a device engineered to emit at 10 μm. These I-V characteristics highlight the fact that high power dissipation creates the need for good thermal management solutions, as heat generation will ultimately limit optical power. From a modulation perspective, driving large currents at higher voltages requires high power RF or microwave sources. Viability of applications where direct modulation of a conventional QCL is required would therefore be limited by size, weight, and power of the total system.

It is among the objects of the present invention to overcome disadvantages and limitations of existing quantum cascade lasers and techniques, as just described, and to set forth light emitting devices and methods that exhibit various operational advantages, as will be described.

SUMMARY OF THE INVENTION

In accordance with a form of the invention, a method is set forth for producing light emission, comprising the following steps: providing a transistor structure that includes a semiconductor base region disposed between a semiconductor emitter region and a semiconductor collector region; providing a cascade region between said base region and said collector region, said cascade region comprising a plurality of sequences of quantum size regions, the quantum size regions of said sequences varying, in the direction toward the collector region, from a relatively higher energy state to a relatively lower energy state; providing emitter, base and collector electrodes respectively coupled with said emitter, base, and collector regions; and applying electrical signals with respect to said emitter, base, and collector electrodes to cause and control light emission from said cascade region.

In an embodiment of this form of the invention, the step of providing said cascade region comprises providing said sequences of quantum size regions as sequences of barrier-separated quantum wells having thicknesses that vary, in the direction toward said collector region, from relatively narrower to relatively wider. In this embodiment, the method further comprises providing an optical resonant cavity enclosing at least a portion of said cascade region, and said light emission comprises laser emission. In a form of this embodiment, the transistor structure and cascade region are in a vertically layered configuration, and said step of providing an optical resonant cavity comprises providing said cavity with horizontally opposed reflectors, whereby said laser emission is edge-oriented emission. In another form of this embodiment, said step of providing an optical resonant cavity comprises providing said cavity with vertically opposed reflectors, whereby said laser emission is vertically oriented emission. In another embodiment of this form of the invention, a quantum size region is provided in said base region, and said step of applying electrical signals with respect to said emitter, base, and collector electrodes is further operative to cause and control light emission from said base region.

In accordance with another form of the invention, a semiconductor light-emitting device is set forth, comprising: a transistor structure that includes a semiconductor base region disposed between a semiconductor emitter region and a semiconductor collector region; a cascade region disposed between said base region and said collector region, said cascade region comprising a plurality of sequences of quantum size regions, the quantum size regions of said sequences varying, in the direction toward the collector region, from a relatively higher energy state to a relatively lower energy state; and emitter, base and collector electrodes respectively coupled with said emitter, base, and collector regions; whereby electrical signals applied with respect to said emitter, base, and collector electrodes are operative to cause and control light emission from said cascade region.

In an embodiment of this form of the invention, said cascade region comprises sequences of barrier-separated quantum wells which vary in thickness, in the direction toward said collector region, from relatively narrower to relatively wider. In this embodiment, an optical resonant cavity enclosing at least a portion of said cascade region, and said light emission comprises laser emission. Also in this embodiment, an oxide-defined top aperture is provided between said base and emitter regions, said collector region includes a collector layer and a subcollector layer to which said collector electrode is coupled, and an oxide-defined bottom aperture is provided between said collector and subcollector layers.

As described, a feature of embodiments of the invention involves utilization of a version of a QCL structure in the base-collector junction of a heterojunction bipolar transistor. A review of certain aspects of the simpler bipolar junction transistor (BJT) can be used to provide insight into why the present invention provides advantages over existing n+-i-n QCL devices and techniques.

A depiction of the current flow in a BJT having emitter 511, base 512, and collector 513, is shown in FIG. 5. In the illustrated n-p-n bipolar junction transistor under static operation for standard biasing conditions, electrons are injected into the forward-biased n-p emitter-base junction, travel across a thin base region which has a thickness significantly less than the diffusion length of electrons in the material of the base, and are collected by the reverse-biased base-collector junction where they are swept out of the base-collector depletion region by the fields created by the applied bias. Electron flow is controlled by the hole current from the base electrode.

Because charge neutrality must be maintained in the base region between the emitter-base and base-collector depletion regions, excess electrons must be injected by the emitter to compensate for those being swept away by the collector. This is the basic principle by which current amplification is achieved, and why a small base current $I_B$ can control a large emitter and collector current. The BJT gain can be quantified by taking the ratio of the electron lifetime in the base to the electron transit time through the base:

$$\beta = \tau_e/\tau_t \quad (1)$$

For the normal case of a forward-biased emitter junction and a reverse-biased collector junction, the collector current can be described by the equation $$I_C = \beta I_B \quad (2)$$

where β is the gain as described in (1) and $I_C$ and $I_B$ are the collector and base currents, respectively.

A representation of the family of curves for a BJT under standard operation is illustrated in FIG. 6. As seen in the Figure, collector current is controlled by the base current $I_b$, and is largely independent of collector-emitter voltage. Collector current is related to the base current by the amplification factor β, which is a characteristic of the device determined by design. The collector current $I_c$ can be easily switched or modulated with the smaller base current $I_b$. Additionally, since the magnitude of the current flowing through the base-collector junction is largely independent of base-collector reverse bias voltage and determined almost exclusively by the emitter-base current, currents can be switched through the base-collector junction with minimal change to the electric field in that junction.

In accordance with a feature of embodiments of the invention, an HBT-like device architecture is utilized to control current injection into a QCL type of structure (i.e., the cascade region thereof) located in the field region of the base-collector junction of a transistor device. This approach decouples field from current in the cascade region, allowing independent control of both parameters. This has fundamental advantages over an n+-i-n structure where field and current cannot be decoupled. There is a clear advantage for modulation. The voltage drop across the forward-biased emitter-base junction is small, and switching and modulation of the large collector current $I_C$ with the much smaller base current $I_B$ allows the use of lower power external RF drive circuitry. Additionally, the field across the cascade region structure in the device remains effectively constant during modulation, so the energy levels and wave function overlap of the quantum states in the cascade region are not perturbed by the modulation voltage. From a laser perspective, where stimulated emission relies on a transition of specific energy, not changing the transition energy is advantageous. At the same time, fields in the cascade region can be controlled independently from the current flow through the region if desired. Intentionally modulating the base-collector voltage allows bi-directional wavelength modulation or sweeping if needed for an application such as absorption spectroscopy. This wavelength modulation can be performed at a fixed current level.

With regard to optical power, placing the cascade region in the depletion region of a reverse-biased junction allows the optimization of doping to reduce free-carrier absorption. In a conventional QCL, doping levels must be selected which minimize free carrier absorption yet do not cause excess ohmic loss and subsequent heating. Operating voltage and current flow are directly tied, as the conventional QCL is effectively a non-linear resistor. In embodiments hereof, however, it is advantageous from a device perspective to have a lightly doped base. In an embodiment hereof a p-type base is doped in a range about $10^{16}$ to $10^{17}$ carriers per $cm^3$. Graded and/or stepped doping can be employed to advantage. For applications requiring operation at high speed, increasing the doping density, at least in the region near the emitter-base junction, is preferred. Grading, higher to lower, of the base doping from the emitter to the collector is further desirable because it creates an internal field that aids in electron transport across the base. It is desirable to have doping levels that create a depletion region that extends through the region of the p-i-n base-collector junction where the optical field intensity is greatest, since if a region is depleted, free carrier absorption is minimized. Additionally, the hetero-interface at the emitter-base junction can provide optical confinement, minimizing optical losses from the n+ emitter. Minimizing free carrier loss contributes to a reduction in laser threshold current densities as compared to a conventional QCL. A reduction in overall operating current will reduce device heating, and allow operation to higher powers before device rollover. Additionally, the device structure, which is partially based on a HBT architecture, is capable of injecting relatively high current densities through the base-collector junction. High-speed HBTs are operated at current densities in excess of $10^5$ Amps per centimeter squared whereas conventional QCLs are typically limited to a few thousand Amps per centimeter squared.

Further features and advantages of the invention will become more readily apparent from the following detailed description when taken in conjunction with the accompanying drawings.

DETAILED DESCRIPTION

Figure 7:
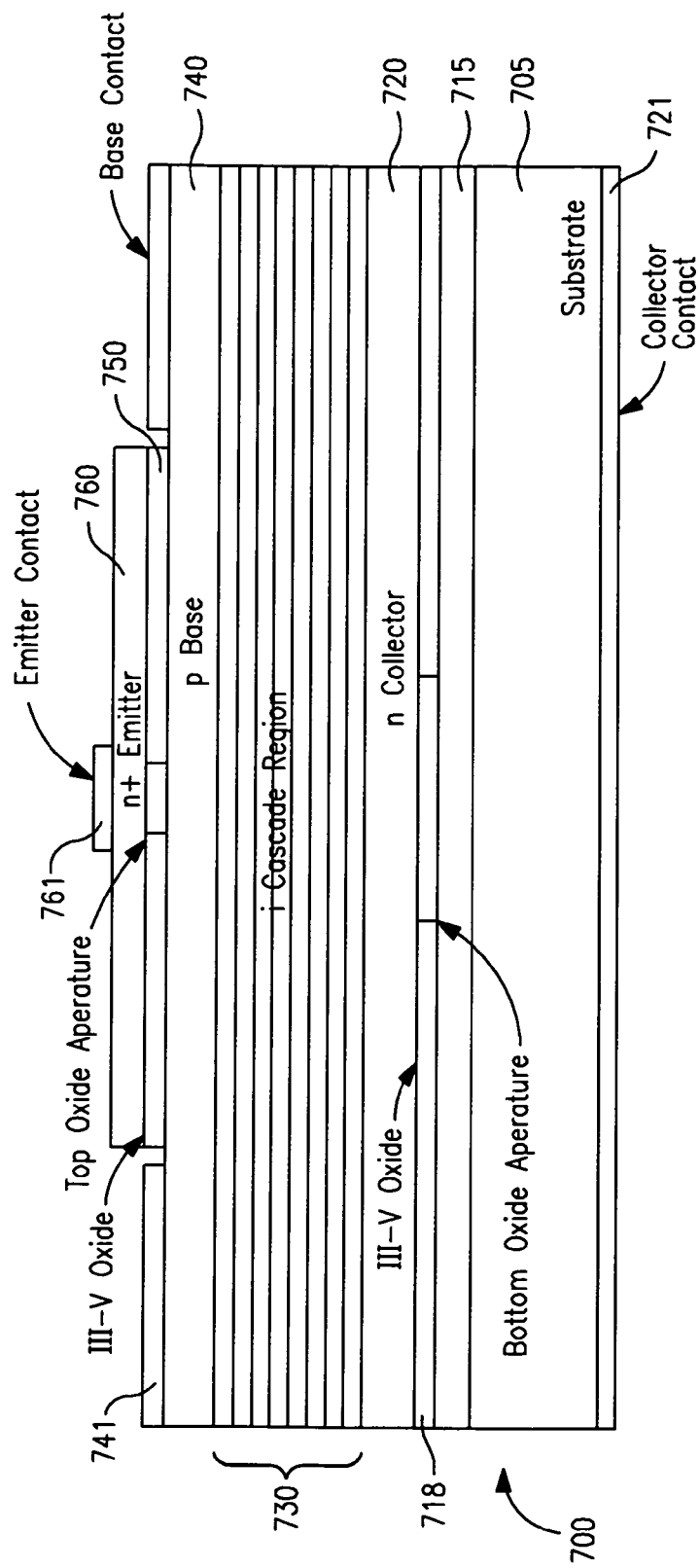
FIG. 7 is a cross-sectional view, not to scale, of a device in accordance with an embodiment of the invention and which can be used in practicing an embodiment of the method of the invention.

FIG. 7 is a diagram of a device 700 in accordance with an embodiment of the invention, and which can be used in practicing an embodiment of the method of the invention. Devices hereof can be made using, for example, epitaxial deposition, such as metal organic chemical vapor deposition, and molecular beam epitaxy for superlattice layers, and/or any other suitable techniques, including techniques conventionally used to fabricate heterojunction bipolar transistors (HBTs) and quantum cascade lasers (QCLs). The device of FIG. 7 employs a conductive substrate 705 having a subcollector layer 715 disposed thereon, followed by an oxide-defined aperture layer 718 and a collector layer 720 which, in the present embodiment, is n-type. The aperture can be made using a buried oxide layer, formed using lateral oxidation (see, for example, S. A. Maranowski, A. R. Sugg, E. I Chen, and N. Holonyak, Jr., "Native Oxide Top-and Bottom-Confined Narrow Stripe p-n $Al_y Ga_{1-y}As$—GaAs—$In_x Ga_{1-x}As$ Quantum Well Heterostructure Laser," Appl. Phys. Let. 63 (12), 1660 (1993); and D. L. Huffaker, D. G. Deppe, K. Kumar, and T. J. Rogers, "Native-Oxide Defined Ring Contact for Low Threshold Vertical-Cavity Lasers," Appl. Phys. Lett 65 (1), 97 (1994)). Disposed between the collector layer 720 and a p-type semiconductor base layer 740 is a cascade region 730, which includes layers 731, 732, . . . , and which is described further hereinbelow. In the present embodiment, above the base region 740 is a mesa that includes another oxide-defined aperture layer 750 between the base region and a semiconductor emitter layer 760 which, in the present embodiment, is an n+ (heavily doped n-type) layer. The buried oxide layers are used to provide both current and optical mode confinement. A bottom collector contact or electrode 721 contacts the conductive substrate 705 for effective coupling to the collector 720 via the subcollector 715. An annular base contact or electrode 741 contacts the base region 740, and a top emitter contact or electrode 761 contacts the emitter region 760.

Various semiconductor material systems can be employed in embodiments hereof. In one example, the substrate can be GaAs, the collector region can be GaAs, the base region can be GaAs or AlGaAs, and the emitter region can be InGaP or AlGaAs. In this example, in the cascade region, the barrier layers can be AlAs or AlGaAs and the quantum wells can be GaAs or InGaAs. In a further example, the substrate can be InP, the collector region can be InGaAs or InP, the base region can be InGaAs or InP, and the emitter region can be InAlAs. In this further example, in the cascade region, the barrier layers can be InAlAs and the quantum wells can be InGaAs. In addition to these and other III-V material systems, suitable II-VI material systems can also be employed.

Figure 1:
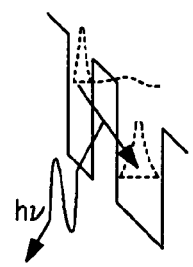
FIG. 1 is an energy diagram showing electron transition in a quantum cascade laser from high-energy quantum state to low-energy quantum state. For simplicity of illustration, adjacent layers that facilitate electron injection into and removal from these states are not shown in the Figure.
Figure 2C:
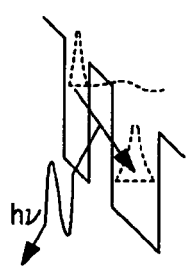
FIG. 2, which includes energy diagrams 2(*a*) and 2(*b*) and a graph 2(*c*), illustrates the fundamental quantum cascade laser electron transition under two different bias conditions for the simplified FIGS. 2(*a*) and 2(*b*) showing the change in band bending and transition energy. In this illustration, a higher electric field is present across the structure for the case (b). The graph (c) shows the exemplary points (a) and (b) on an I-V plot.
Figure 2C:
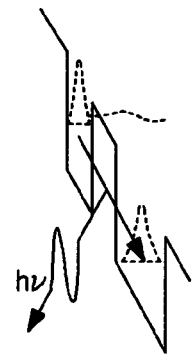
Figure 2C:
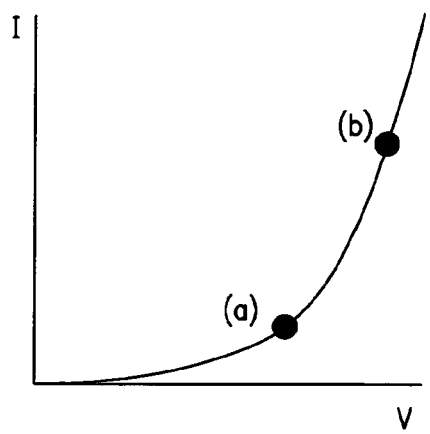
Figure 3:
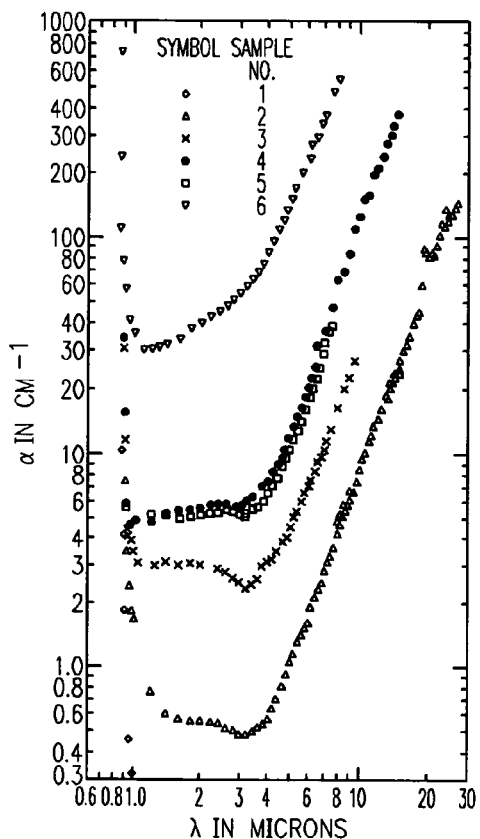
FIG. 3 shows room temperature absorption coefficient as a function of wavelength for six samples shown in the accompanying Table. The Table lists electron concentration and doping impurities for the six samples. The data is from a paper of Spitzer et al. that is referenced in the detailed description hereof.
Figure 4A:
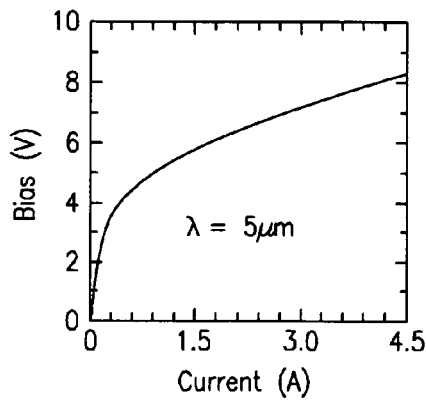
FIG. 4, which includes FIGS. 4(*a*) and 4(*b*), shows current-voltage characteristics for two commercially available quantum cascade lasers. The characteristic of FIG. 4(*a*) is for a QCL emitting at a wavelength of 5 μm, and the curve of FIG. 4(*b*) is for a QCL emitting at 10 μm.
Figure 4B:
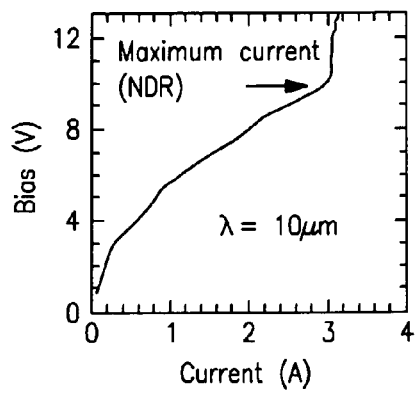
Figure 5:
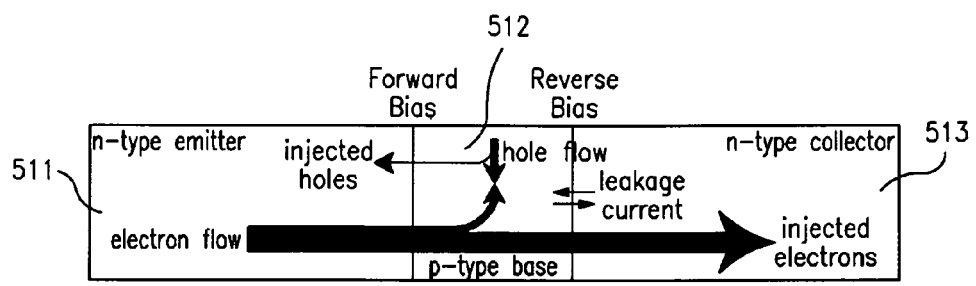
FIG. 5 is a simplified diagram of a bipolar junction transistor (BJT), not to scale, showing carrier flow, and useful in understanding part of the operation of embodiments of the invention.
Figure 6:
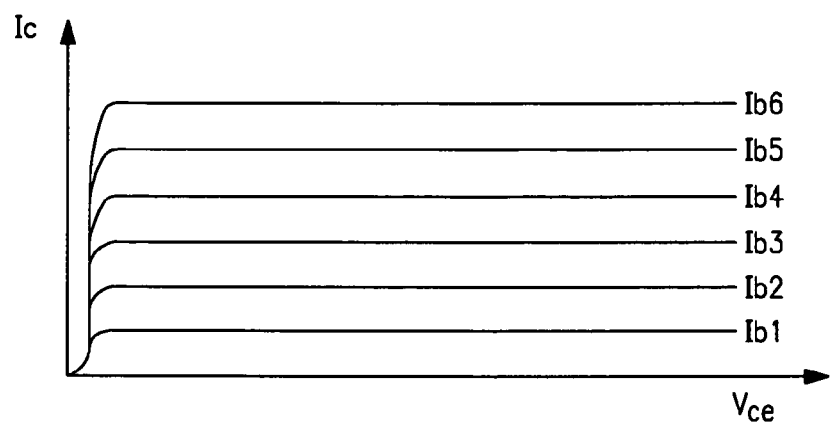
FIG. 6 illustrates representative collector current vs collector-emitter voltage characteristics for the FIG. 5 type of device, for six exemplary base currents $I_{b1}$ through $I_{b6}$.
Figure 8:
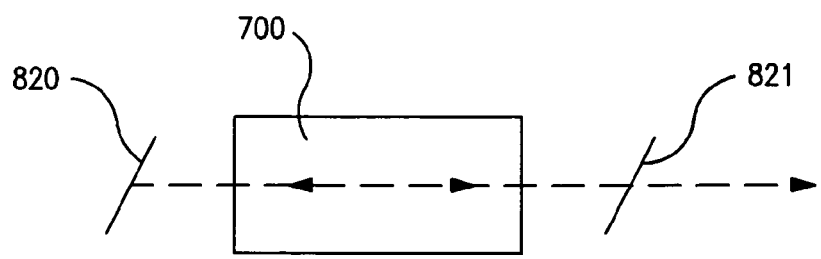
FIG. 8 is a simplified diagram of the device of FIG. 7 or FIG. 10, in conjunction with an optical resonant cavity for laser operation.

FIG. 8 shows the device 700 of FIG. 7 (or the device 1000 of FIG. 10) with at least a portion of its light-emitting cascade region enclosed within an optical resonant cavity, represented by opposing reflectors 820 and 821, to implement laser operation. Reflector 821 is partially transmissive to obtain a laser output. As is typical for semiconductor laser operation, for lateral (or "edge") emission, the reflectors can be cleaved edges, and for vertical emission, the reflectors can be top and bottom distributed Bragg reflectors (DBRs). It will be understood that any suitable optical cavity or resonator techniques can be employed.

Figure 9:
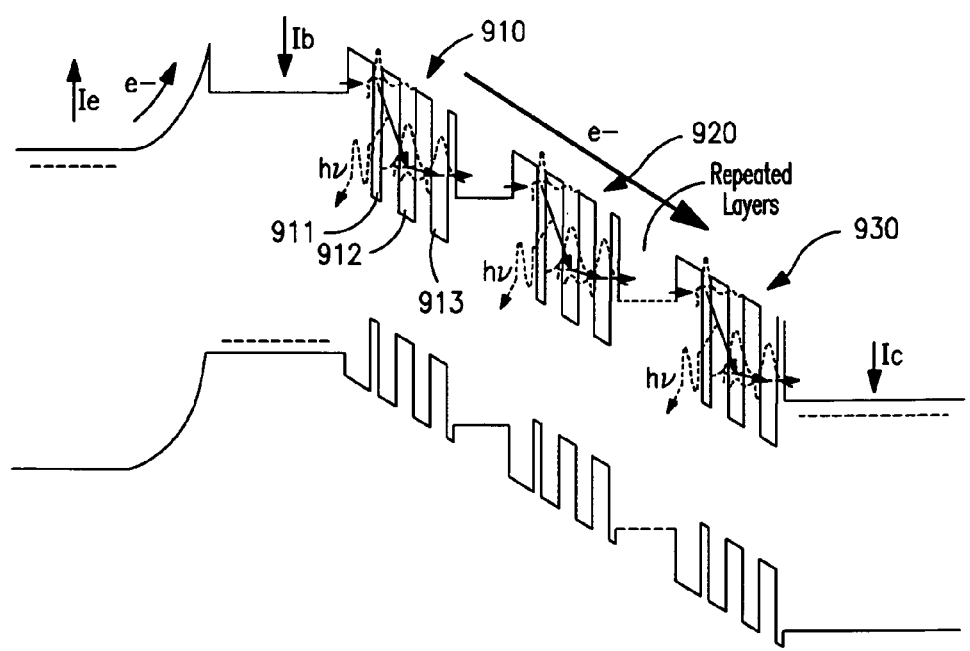
FIG. 9 is an energy band diagram for a transistor-injected quantum transition ("TIQT") laser structure in accordance with embodiments of the invention. The base current $I_b$ controls the emitter and collector currents $I_e$ and $I_c$. The potential gradient across the cascade region remains fixed for this device, in contrast to the conventional QCL where potential gradient changes with current injection level.

FIG. 9 shows a band diagram of the FIG. 7 device for laser operation. In this Figure, the leftmost side is a wide-bandgap n-type emitter, the center portion is a p-type base, and the rightmost side is an n-type collector. The cascade structure is located in the intrinsic region within the p-i-n base-collector junction. In one embodiment, the transition between a high-energy quantum state in a shallow well and low-energy quantum state in a deep well creates gain at the required wavelength. The cascade region (730 in FIG. 7) is seen in FIG. 9 to include at least one sequence of quantum size regions separated by semiconductor barrier layers, the quantum size regions varying in energy state from higher to lower in the direction toward the collector region. In the present example, the quantum size regions are semiconductor quantum wells, whose energy levels can be varied by thickness and/or compositionally to control well depth. Alternative quantum size regions, for example quantum dot regions and/or quantum wire regions, can also be utilized. The sequences of energy levels (well depths) are illustrated, for example, at 910, 920, and 930, in the energy band diagram of FIG. 9. For example, for the sequence labeled 910, the depth of the wells increases (i.e., lower energy state) for the sequence of wells 911, 912, and 913, in the direction toward the collector region.

Figure 10:
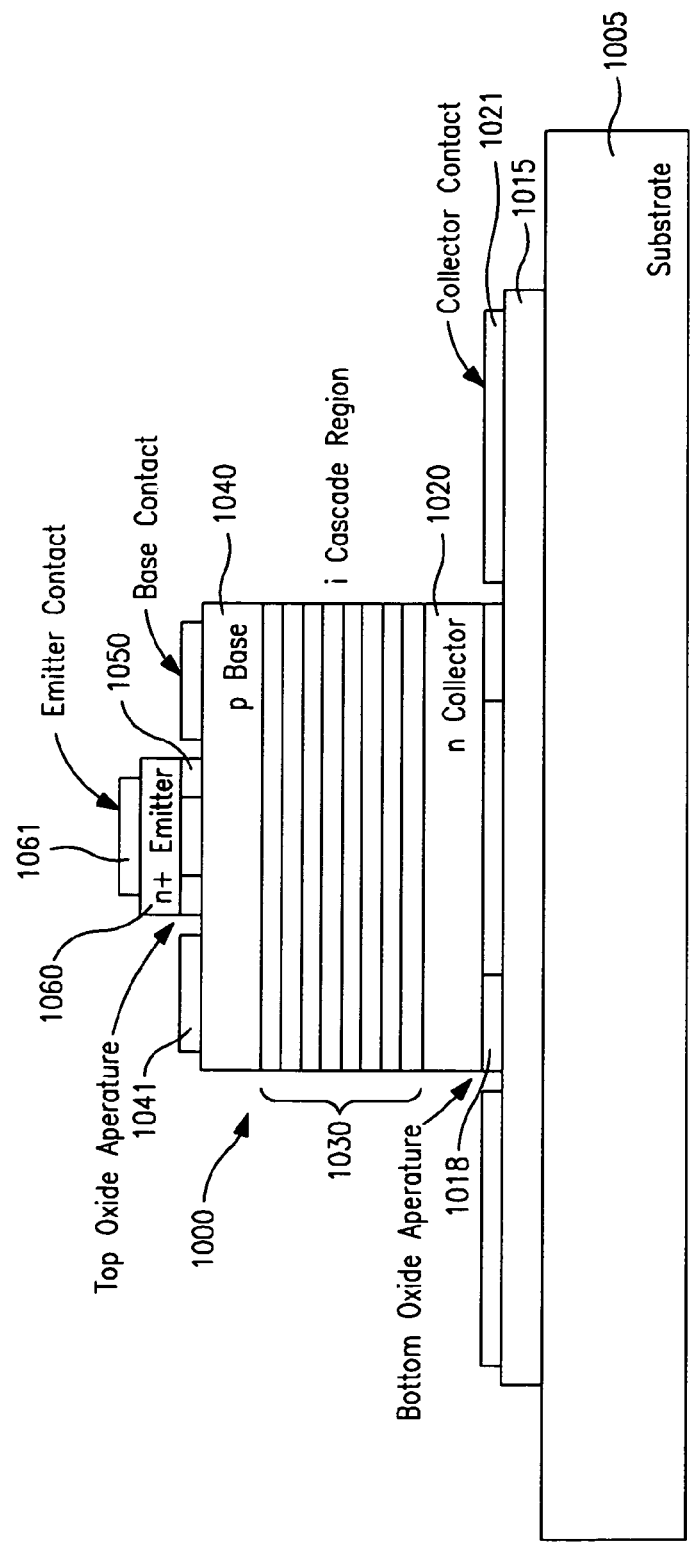
FIG. 10 is a cross-sectional view, not to scale, of a device in accordance with another embodiment of the invention and which can be used in practicing embodiments of the method of the invention.

FIG. 10 illustrates a device 1000 of an embodiment of the invention that employs an insulating semiconductor substrate 1005. An insulating substrate can be used to enhance modulation speed. In this embodiment, there is no bottom collector electrode as in the FIG. 7 embodiment. Instead, deposited on an n-type subcollector 1015 is a mesa that includes bottom oxide aperture 1018, n-type collector 1020, cascade region 1030, and p-type base region 1040. The collector electrode 1021 is formed as a contact on the periphery of subcollector layer 1015. Another mesa, deposited over the base region, includes top aperture 1050, n+ emitter region 1060, and emitter electrode or contact 1061. The base electrode is formed as an annular contact on the periphery of base region 1040.

As has been described, an HBT-like device architecture is utilized to control current injection into a QCL type of structure (i.e., the cascade region thereof) located in the field region of the base-collector junction of a transistor device. This approach decouples field from current in the cascade region, allowing independent control of both parameters. This has fundamental advantages over an n+-i-n structure where field and current cannot be decoupled. There is a clear advantage for modulation. The voltage drop across the forward-biased emitter-base junction is small, and switching and modulation of the large collector current $I_C$ with the much smaller base current $I_B$ allows the use of lower power external RF drive circuitry. Additionally, the field across the cascade region structure in the device remains effectively constant during modulation, so the energy levels and wave function overlap of the quantum states in the cascade region are not perturbed by the modulation voltage. From a laser perspective, where stimulated emission relies on a transition of specific energy, not changing the transition energy is advantageous. At the same time, fields in the cascade region can be controlled independently from the current flow through the region if desired. Intentionally modulating the base-collector voltage allows bi-directional wavelength modulation or sweeping if needed for an application such as absorption spectroscopy. This wavelength modulation can be performed at a fixed current level.

As was summarized above, with regard to optical power, placing the cascade region in the depletion region of a reverse-biased junction allows the optimization of doping to reduce free-carrier absorption. In a conventional QCL, doping levels must be selected which minimize free carrier absorption yet do not cause excess ohmic loss and subsequent heating. Operating voltage and current flow are directly tied, as the conventional QCL is effectively a non-linear resistor. In embodiments hereof, however, it is advantageous from a device perspective to have a lightly doped base. Additionally, the hetero-interface at the emitter-base junction can provide optical confinement, minimizing optical losses from the n+ emitter. Minimizing free carrier loss contributes to a reduction in laser threshold current densities as compared to a conventional QCL. A reduction in overall operating current will reduce device heating, and allow operation to higher powers before device roll-over. Additionally, the device structure, which is partially based on a HBT architecture, is capable of injecting relatively high current densities through the base-collector junction.

Figure 11:
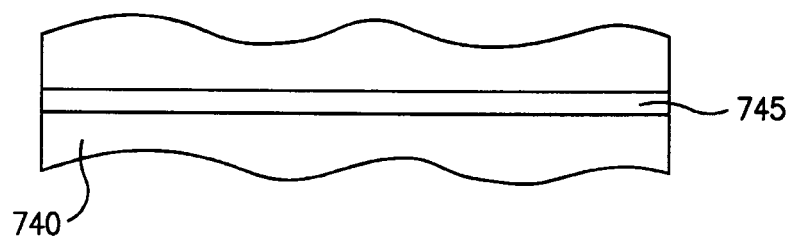
FIG. 11 is a partially broken-away cross-sectional view, not to scale, of the base region of the device of FIG. 7 or FIG. 10, containing a quantum size region.

FIG. 11 illustrates a further embodiment of the invention which can be utilized to obtain simultaneous light emission at plural different wavelengths. FIG. 11 shows a cutaway view of the base region 740 of the device 700 of FIG. 7 which, in this embodiment, includes one or more quantum size regions such as one or more quantum wells 745. In this embodiment, the heterojunction bipolar transistor portion of the device can act as a light-emitting transistor or a transistor laser. (In the latter case, an optical resonant cavity encloses at least a portion of the light-emitting base region of the device, as was described in conjunction with FIG. 8 with respect to the optical resonant cavity for the cascade region). [For background relating to light-emitting transistors and transistor lasers, reference can be made, for example, to U.S. Pat. Nos. 7,091,082, 7,286,583, 7,354,780, 7,535,034 and 7,693,195; U.S. Patent Application Publication Numbers US2005/0040432, US2005/0054172, US2008/0240173, US2009/0134939, US2010/0034228, US2010/0202483, and US2010/0202484; and to PCT International Patent Publication Numbers WO/2005/020287 and WO/2006/093883.] In operation, in addition to emission from the cascade region at the characteristic wavelength thereof, there will also be emission from the base region, at its characteristic wavelength, in the manner of an LET or TL.

The invention claimed is:

1. A method for producing light emission, comprising the following steps:
   providing a transistor structure that includes a semiconductor base region disposed between a semiconductor emitter region and a semiconductor collector region;
   providing a cascade region between said base region and said collector region, said cascade region comprising a plurality of sequences of quantum size regions, the quantum size regions of said sequences varying, in the direction toward the collector region, from a relatively higher energy state to a relatively lower energy state;
   providing emitter, base and collector electrodes respectively coupled with said emitter, base, and collector regions; and
   applying electrical signals with respect to said emitter, base, and collector electrodes to cause and control light emission from said cascade region.

2. The method as defined by claim 1, wherein said step of providing said cascade region comprises providing said sequences of quantum size regions as sequences of barrier-separated quantum wells;

3. The method as defined by claim 2, wherein said step of providing said sequences of barrier-separated quantum wells comprises varying the thicknesses of said quantum wells, in the direction toward said collector region, from relatively narrower to relatively wider.

4. The method defined by claim 1, wherein said step of providing a plurality of sequences of quantum size regions comprises providing a multiplicity of said sequences of quantum size regions.

5. The method as defined by claim 1, further comprising providing an optical resonant cavity enclosing at least a portion of said cascade region, and wherein said light emission comprises laser emission.

6. The method as defined by claim 3, further comprising providing an optical resonant cavity enclosing at least a portion of said cascade region, and wherein said light emission comprises laser emission.

7. The method as defined by claim 5, wherein said transistor structure and cascade region are in a vertically layered configuration, and wherein said step of providing an optical resonant cavity comprises providing said cavity with horizontally opposed reflectors, whereby said laser emission is edge-oriented emission.

8. The method as defined by claim 5, wherein said transistor structure and cascade region are in a vertically layered configuration, and wherein said step of providing an optical resonant cavity comprises providing said cavity with vertically opposed reflectors, whereby said laser emission is vertically oriented emission.

9. The method as defined by claim 5, further comprising providing a top aperture between said base and emitter regions.

10. The method as defined by claim 5, wherein said step of providing a collector region includes providing a collector layer and a subcollector layer to which said collector electrode is coupled, and further comprising providing a bottom aperture between said collector and subcollector layers.

11. The method as defined by claim 9, wherein said step of providing a collector region includes providing a collector layer and a subcollector layer to which said collector electrode is coupled, and further comprising providing a bottom aperture between said collector and subcollector layers.

12. The method as defined by claim 9, wherein said step of providing said top aperture comprises providing an oxide-defined top aperture.

13. The method as defined by claim 10, wherein said step of providing said bottom aperture comprises providing an oxide-defined bottom aperture.

14. The method as defined by claim 1, further comprising providing a quantum size region in said base region, and wherein said step of applying electrical signals with respect to said emitter, base, and collector electrodes is further operative to cause and control light emission from said base region.

15. A semiconductor light-emitting device, comprising:
   a transistor structure that includes a semiconductor base region disposed between a semiconductor emitter region and a semiconductor collector region;
   a cascade region disposed between said base region and said collector region, said cascade region comprising a plurality of sequences of quantum size regions, the quantum size regions of said sequences varying, in the direction toward the collector region, from a relatively higher energy state to a relatively lower energy state; and emitter, base and collector electrodes respectively coupled with said emitter, base, and collector regions;

whereby electrical signals applied with respect to said emitter, base, and collector electrodes are operative to cause and control light emission from said cascade region.

16. The device as defined by claim 13, wherein said cascade region comprises sequences of quantum size regions as sequences of barrier-separated quantum wells.

17. The device as defined by claim 16, wherein said barrier-separated quantum wells vary in thickness, in the direction toward said collector region, from relatively narrower to relatively wider.

18. The method as defined by claim 15, wherein said plurality of sequences of quantum size regions comprises a multiplicity of sequences of quantum size regions.

19. The device as defined by claim 15, further comprising an optical resonant cavity enclosing at least a portion of said cascade region, and wherein said light emission comprises laser emission.

20. The device as defined by claim 17, further comprising an optical resonant cavity enclosing at least a portion of said cascade region, and wherein said light emission comprises laser emission.

21. The device as defined by claim 18, wherein said transistor structure and cascade region are in a vertically layered configuration, and wherein said optical resonant cavity comprises horizontally opposed reflectors, whereby said laser emission is edge-oriented emission.

22. The device as defined by claim 19, wherein said transistor structure and cascade region are in a vertically layered configuration, and wherein said optical resonant cavity comprises vertically opposed reflectors, whereby said laser emission is vertically oriented emission.

23. The device as defined by claim 19, further comprising a top aperture between said base and emitter regions.

24. The device as defined by claim 19, wherein said collector region includes a collector layer and a subcollector layer to which said collector electrode is coupled, and further comprising a bottom aperture between said collector and subcollector layers.

25. The device as defined by claim 23, wherein said collector region includes a collector layer and a subcollector layer to which said collector electrode is coupled, and further comprising a bottom aperture between said collector and subcollector layers.

26. The device as defined by claim 23, wherein said top aperture comprises an oxide-defined top aperture.

27. The device as defined by claim 24, wherein said bottom aperture comprises an oxide-defined bottom aperture.

28. The device as defined by claim 15, further comprising a quantum size region in said base region, whereby said electrical signals applied with respect to said emitter, base, and collector electrodes are further operative to cause and control light emission from said base region.

* * * * *